（12） United States Patent
Chen et al.

(10) Patent No.: US 11,268,661 B2
(45) Date of Patent: Mar. 8, 2022

(54) LIGHTING APPARATUS WITH COLOR ADJUSTMENT FUNCTION

(71) Applicant: XIAMEN LEEDARSON LIGHTING CO., LTD, Fujian (CN)

(72) Inventors: Yanbiao Chen, Fujian (CN); Hongkui Jiang, Fujian (CN)

(73) Assignee: XIAMEN LEEDARSON LIGHTING CO., LTD, Fujian (CN)

( * ) Notice: Subject to any disclaimer, the term of this patent is extended or adjusted under 35 U.S.C. 154(b) by 0 days.

(21) Appl. No.: 17/017,698

(22) Filed: Sep. 11, 2020

(65) Prior Publication Data

US 2021/0095823 A1  Apr. 1, 2021

(30) Foreign Application Priority Data

Sep. 29, 2019 (CN) .......................... 201921648138.7

(51) Int. Cl.
*F21K 9/64* (2016.01)
*H01L 33/50* (2010.01)
*F21S 2/00* (2016.01)
*F21V 23/00* (2015.01)
*F21Y 115/10* (2016.01)

(52) U.S. Cl.
CPC ................ *F21K 9/64* (2016.08); *F21S 2/005* (2013.01); *F21V 23/009* (2013.01); *H01L 33/502* (2013.01); *F21Y 2115/10* (2016.08)

(58) Field of Classification Search
CPC .... F21K 9/64; F21K 9/61; F21K 9/232; F21S 2/005; F21V 23/009; F21V 23/045; H01L 33/502; H01L 25/0753; F21Y 2115/10; F21Y 2113/17; F21Y 2113/13
See application file for complete search history.

(56) References Cited

U.S. PATENT DOCUMENTS

| 2009/0147508 | A1* | 6/2009 | Bertram | .................... F21K 9/00 362/231 |
| 2012/0242247 | A1* | 9/2012 | Hartmann | ............ H05B 47/185 315/294 |
| 2014/0239828 | A1* | 8/2014 | Smith | .................... H05B 45/20 315/187 |
| 2017/0241601 | A1* | 8/2017 | Li | ......................... F21V 29/773 |
| 2017/0279015 | A1* | 9/2017 | Ryu | ...................... H01L 33/647 |
| 2018/0087759 | A1* | 3/2018 | Mathews | ................ F21K 9/232 |
| 2021/0100080 | A1* | 4/2021 | Chen | .................... H05B 45/325 |

* cited by examiner

*Primary Examiner* — Tracie Y Green
(74) *Attorney, Agent, or Firm* — Chun-Ming Shih; Lanway IPR Services

(57) ABSTRACT

A lighting apparatus includes a first LED module, a second LED module, a third LED module, and a light source plate. The first LED module includes a first package frame disposing a first LED chip and a second LED chip. It is similar to arrange the second LED module and the third LED module. The LED chips are configured to arrange a high color temperature LED chip, a green LED chip, a red LED chip, a blue LED chip, and a low color temperature LED chip together with an antenna module.

18 Claims, 8 Drawing Sheets

LIGHTING APPARATUS WITH COLOR ADJUSTMENT FUNCTION

FIELD

The present invention is related to a lighting apparatus, and more particularly related to a lighting apparatus with color adjustment function.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

It is beneficial to provide a lighting device that can be adjusted dynamically according to different scenarios. For example, in the day time or in the deep night, people may need different types of lights.

When such needs change dynamically, it is beneficial for providing a design for controlling the lighting apparatus to adjust quickly and conveniently.

SUMMARY

In some embodiments, a lighting apparatus includes a first LED module, a second LED module, a third LED module and a light source plate.

The first LED module includes a first package frame disposing one color type LED chip and one first type white LED chip.

The second LED module includes a second package frame disposing one first type white LED chip and one second type white LED chip.

The third LED module includes a third package frame disposing one low type white LED.

The light source plate is used for mounting the first LED module, the second LED module and the third LED module.

The first type white LED chip emits a first white light of a first color temperature. The second type white LED chip emits a second white light of a second color temperature. The first color temperature is higher than the second color temperature. The color type LED chip is selected from a red LED chip, a blue LED chip and a green LED chip.

In some embodiments, the first type white LED chips of the first LED module and the second LED module are connected and controlled at the same time. The second type white LED chips of the second LED module and the third LED module are connected and controlled at the same time.

In some embodiments, there are three first LED modules respectively containing a different color type LED chip.

In some embodiments, a total numbers of the second LED module and the third LED module are the same as a total number of the first LED modules.

In some embodiments, multiple first LED modules are surrounded by the multiple second LED modules and the multiple third LED modules.

In some embodiments, the first color temperature of the first type white LED chip is between 3500K to 6500K and the second color temperature of the second type white LED chip is between 500K to 3000K.

In some embodiments, the lighting apparatus may also include a manual switch for manually disabling a portion of the first color type LED chip, the first type white LED chip, and the second type white LED chip.

In some embodiments, the antenna module receives an external command to force re-activate the disabled the LED chips configured by the manual switch.

In some embodiments, a lighting apparatus includes a first LED module, a second LED module, a third LED module, and a light source plate.

The first LED module includes a first package frame disposing a first LED chip and a second LED chip.

The second LED module includes a second package frame disposing a third LED chip and a fourth LED chip.

The third LED module includes a third package frame disposing a fifth LED chip and a sixth LED chip.

The light source plate is used for mounting the first LED module, the second LED module and the third LED module.

A total number of red color type among the first LED chip, the second LED chip, the third LED chip, the fourth LED chip, the fifth LED chip and the sixth LED chip is more than a total number of green color type among the first LED chip, the second LED chip, the third LED chip, the fourth LED chip, the fifth LED chip and the sixth LED chip.

In some embodiment, the lighting apparatus is a light bulb device. In some other embodiments, the lighting apparatus may be a downlight device, a panel light device, a spot light device or other types of lighting devices.

In the bulb light example, the bulb light device may have a light source plate, e.g. an aluminum plate with a conductive layer, a heat dissipation layer and an insulation layer mounted with LED modules.

The LED modules have package frames. The package frames have internal wiring for connecting LED chips to external electrodes for receiving driving currents.

Different LED modules may be connected to a driver separately or may be connected in series, in parallel, partly in parallel and partly in series.

A bulb shell may be used for enclosing the LED modules. An Edison cap, with or without a heat sink cup portion may be attached to the bulb shell.

In some embodiments, the driver that is used for converting an external power source, e.g. 110V/220V alternating current to a direct current power source may be made as a module enclosed by the Edison cap.

Part of the components of the driver may be disposed on the same side or the opposite side as the LED modules on the light source plate.

The driver may have its own circuit board, which is plugged to the light source plate with elastic metal pins so as to eliminate welding process.

In some embodiments, each LED module has more than two LED chips. In some embodiments, each LED module has only two LED chips.

For example, when needed, the first LED module has only two LED chips, while the second LED module has more than two LED chips. However, it is found in some cases that using only two LED chips meets certain optimization on light quality, assembly cost or some other factors.

In some embodiments, among the LED chips in the first LED module, the second LED module and the third LED module, the number of red LED chips, which may appear in all three LED modules have a larger number than the blue LED chips. The blue LED chips may have a larger number than the green LED chips.

For example, the first LED module has a red LED chip and a green LED chip. The second LED module has a red LED chip and a blue LED chip. The third LED module has a red LED chip and a blue LED chip. In such configuration, there are three red LED chips, two blue LED chips and one green LED chip.

Other configuration may be set but at least the configuration mentioned above is found very effective on finding balance in light device design for ensuring sufficient red and blue light being produced.

In some embodiments, the lighting apparatus may also include an antenna module disposed at a center of the light source plate.

The antenna has a protruding part from the light source plate.

The first LED module, the second LED module and the third LED module are disposed surrounding the antenna module.

People expect to add more functions and flexibility to light devices. Using wireless communication is an option. By using wireless communication, it is important to deploy an effective antenna to ensure signal quality.

In some embodiments, there is an antenna module disposed at a center of the light source plate. In the example of a bulb device, the light source plate may have a circular shape as a circular disk. In the center of the circular disk, an antenna module is disposed facing upwardly as the LED modules mentioned above toward the bulb shell.

In some embodiments, the antenna module has a plate and the plate has a protruding part protruding from a surface of the light source plate upwardly.

The LED modules are arranged surrounding the antenna module.

In some embodiments, the antenna module has a reflective layer for reflecting a light of the first LED module, the second LED module and the third LED module.

To more effectively increase light efficiency and decrease side effect of the protruding part of the antenna module, the antenna module may be added, painted or attached with a reflective layer for reflecting, instead of absorbing the light of the LED module, toward the bulb shell or other light passing cover and lens.

To further increase the light efficiency, the protruding part may have a tilt angle, designed for guiding the path and direction of the reflected light. Concave or Convex structures that may change light paths may be added to the light source module too.

In some embodiments, a fluorescent layer is disposed on the antenna module.

In some embodiments, the antenna module may be added in partial area or complete area with a fluorescent layer.

When a light emitted from the LED modules hits the fluorescent layer, a light with different wave spectrum may be generated. For example, a light with a first color is emitted on a fluorescent layer and then certain reflected light may be transformed to another color of light.

In some embodiments, the antenna module has a fourth LED module.

In some embodiments, when the antenna module has a protruding part, it is helpful to use the protruding part to add a light source or more light sources to add light emitted to cover more directions.

For example, one or multiple LED chips may be added on a plate of the antenna module. If the plate is a vertical board arising from the light source plate, the plate may be used for supporting the added light source, like a filament or a flexible filament mounted with LED chips.

The added light source may be used for mixing a desired light parameter with a driver.

In some embodiments, the fourth LED module may be used for providing a status of the wireless module or the driver, e.g. a blinking red light showing a first status while a green light showing another status, e.g. everything is ok for the smoke detector integrated with the lighting apparatus.

In some embodiments, the fourth LED module emits a light to a light guide of the antenna module.

In some embodiments, the plate of the antenna module may have a light guide. The light guide may be made of plastic transparent materials with lots of micro dots on a surface for guiding light to emit from the micro dots.

In addition to increase visual effect, the light guide also changes light paths and guides the light direction to emit at desired positions. It would therefore provide much more flexibility when being combined with driver control.

In some embodiments, a driver circuit is attached on the antenna module.

As mentioned above, the first LED module, the second LED module and the third LED module are controlled by a driver which provides driving currents.

In some embodiments, a portion of the driver circuit of the driver are mounted on the antenna module or completely mounted on the antenna module.

A portion of the antenna module may be exposed and protruding above the light source plate while another portion of the antenna module may be disposed below the light source plate.

By integrating the antenna module and the driver makes assembly easier and provides better reliability of the lighting device.

In some embodiments, the antenna module receives an external command from an external device via the antenna module to activate an eye protection mode for lowering a light intensity of a blue LED device from the first LED module, the second LED module and the third LED module.

A remote control like a mobile phone installed with an associated App may be used for communicating with the antenna module which provides an antenna to a wireless circuit of the driver.

The external command is received from the antenna of the antenna module and decoded by a wireless circuit disposed on the antenna module or integrated with the driver.

The external command may be translated as a mode selection from multiple options.

In some embodiments, the mode selection may be related to an eye protection mode. In the eye protection mode, the blue LED chip on the LED modules mentioned above may be turned off or their intensity being decreased to prevent blue light hurting human eyes.

Such working mode may have some drawbacks but make some users more comfortable when the light spectrum is not expected to cover full range.

In some embodiments, the antenna module receives an external command of an external device from the antenna module to activate a sleep mode for lowering a light intensity of a blue LED device and increasing a light intensity of a red LED device of the first LED module, the second LED module and the third LED module.

In some other option modes, the external command may indicate the wireless circuit of the driver to control the LED modules to lower blue light while adding more red light in a sleep mode.

It is found that with more red lights or lower frequency light, people get sleep or feel more comfortable at night when they do not need to read books or take pictures which may need a more complete light spectrum covering.

In short, the external command may be an abstract command as a sleep mode or an eye protection mode. The drivers at different lighting apparatuses determine respectively a corresponding configuration to achieve the effect of the abstract command.

In such design, the external command does not indicate specifically how to control the LED modules directly.

Instead, the external command from a remote control or a sever that is located at a living room or a remote server room may be configured to indicate a request.

The request is translated by the driver so as to generate corresponding control signals or driving currents for the LED modules.

In some embodiments, the antenna module receives an external command of an external device from the antenna module to activate a color rendering mode optimized for an object type by controlling light intensity parameters of the first LED module, the second LED module and the third LED module.

In some embodiments, users may select a color rendering mode optimized for specific type of objects.

Different light combination may provide better visual rendering effect, color rendering index, for different objects, like vegetable, clothing, metal pieces, food or any objects in different scenarios and different marketing purposes.

Users may use the external command to indicate an object type to be optimized, e.g. green vegetable, fresh fish, and the driver determines a corresponding settings to drive the LED modules.

A color configuration or a function with program codes may be transmitted to the driver to implement such function, too.

In some embodiments, the total number of red color type among the first LED chip, the second LED chip, the third LED chip, the fourth LED chip, the fifth LED chip and the sixth LED chip is more than a total number of blue color type among the first LED chip, the second LED chip, the third LED chip, the fourth LED chip, the fifth LED chip and the sixth LED chip.

In some embodiments, the total number of blue color type among the first LED chip, the second LED chip, the third LED chip, the fourth LED chip, the fifth LED chip and the sixth LED chip is more than the total number of green color type among the first LED chip, the second LED chip, the third LED chip, the fourth LED chip, the fifth LED chip and the sixth LED chip.

In some embodiments, the first LED chip is a red color LED device, the second LED chip is a green color LED device, the third LED chip is a red LED device, the fourth LED chip is a blue LED device, the fifth LED chip is a red LED device, and the sixth LED chip is a blue LED device.

In some embodiments, the LED devices of the same color in the first LED module, the second LED module and the third LED module are connected in series and controlled at the same time.

The LED devices of different colors in the first LED module, the second LED module and the third LED module are controlled separately.

In some embodiments, the lighting apparatus may also include a first white LED module with a first color temperature.

The first white LED module is disposed on the light source plate.

The first white LED module may have a color temperature mainly close to 5000K, as a high color temperature white LED module.

Even the same white LED modules may emit lights of different color temperatures. It is helpful to deploy a white LED module with a certain range of color temperature to adjust the overall light parameter.

In some embodiments, the lighting apparatus may also include a second white LED module with a second color temperature.

The second color white LED module is disposed on the light source plate, and the first color temperature is higher than the second color temperature.

Another white LED module with lower color temperature, e.g. 2000K, may be used together with the first white LED module.

The number 5000K and 2000K may be added with a range separately. For example, the 5000K color temperature may be 3500K to 6500K, and the 2000K color temperature may be 500K to 3500K.

In some embodiments, the first white LED module and the second white LED module are placed more closer than an peripheral edge than the first LED module, the second LED module and the third LED module.

In some embodiments, the first LED module, the second LED module and the third LED module are arranged at center of the light source plate while the first white LED module and the second white LED module are placed at peripheral positions of the light source plate.

It is found such arrangement provides a better light effect in some design requirements.

In some embodiments, a driver is used for supplying driving currents to the first LED module, the second LED module and the third LED module with a PWM circuit.

One LED chip of each of the first LED module, the second LED module and the third LED module is turned off when the other LED chip of each of the first LED module, the second LED module and the third LED module is turned on.

PWM (Pulse Width Modulation) is used for generating a driving current alternatively, to turn on and to turn off at a high frequency.

By adjusting the total time span in which the driving current is turned on, the light intensity of a corresponding LED chip is adjusted.

In some embodiments, the first LED module, the second LED module and the third LED module each has two LED chips. The two LED chips are turned on and turned off at different timing.

Specifically, when one LED chip is turned on at time t0, the other LED chip is turned off at time t0. When the other LED chip is turned on at time t1, the one LED chip is turned off at time time t1.

Only one LED chip is turned on together with the PWM control to make the overall circuit design more elegant and reliable.

In some embodiments, the package frame has a metal pad for mounting the first LED chip has an inwardly concave corner.

The package frame may be made of plastic material. To mount the LED chips in a LED module, two or more metal pads are disposed for mounting the LED chips.

Specifically, when there are two LED chips in one LED module, each LED chip is assigned two metal pads for connecting to a positive terminal and a negative terminal of a power source.

There are four metal pads disposed in the package frame and the four external corners of the overall metal pads are cut inwardly to form four inwardly concave corner to increase reliability and current quality of the LED module.

In some embodiments, two LED chips of the first LED module, the second LED module and the third LED module have independent conductive paths connecting to a driver.

Specifically, the first LED chip is routed to the driver with a conductive path independent from another conductive path for connecting the second LED chip in the same LED module.

The LED chips with the same color may be connected with the same conductive path. For example, all red LED chips on different LED modules are connected and controlled together by the driver for arranging the red LED chips in the same conductive path.

DETAILED DESCRIPTION

Figure 9:
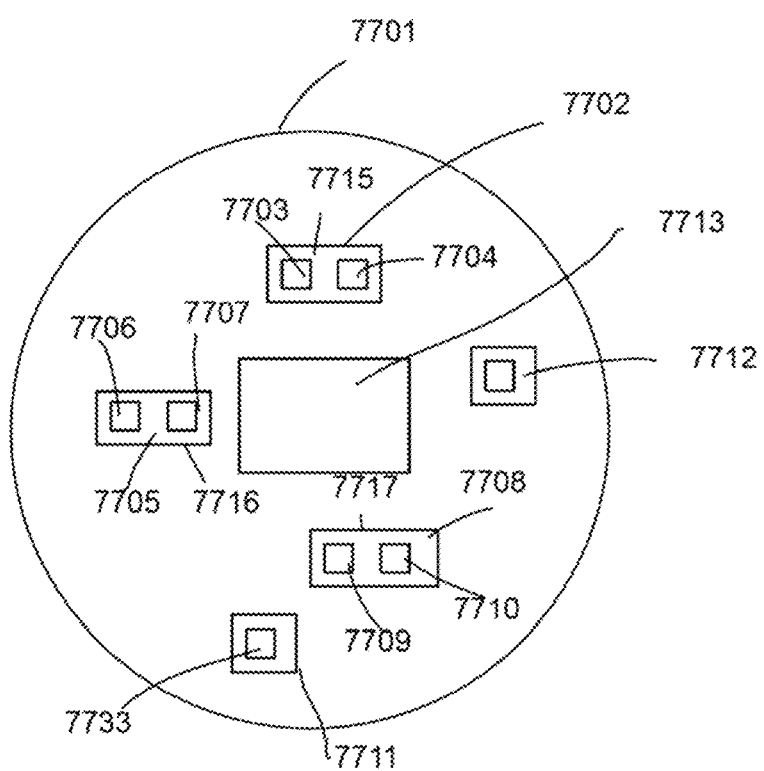
FIG. 9 illustrates a top view of another embodiment.

In FIG. 9, a lighting apparatus includes a first LED module 7702, a second LED module 7705, a third LED module 7711 and a light source plate 7701.

The first LED module 7702 includes a first package frame 7715 disposing one color type LED chip 7703 and one first type white LED chip 7704.

The second LED module 7705 includes a second package frame 7707 disposing one first type white LED chip 7706 and one second type white LED chip 7707.

The third LED module 7711 includes a third package frame 7717 disposing one low type white LED chip 7733.

The light source plate 7701 is used for mounting the first LED module 7702, the second LED module 7705 and the third LED module 7711

The antenna module 7713 is disposed at the center of the light source plate 7701. There may be multiple LED modules, e.g. a second set of LED module 7708 with a package frame 7717 containing one color type chip 7709 and one first type white LED chip 7710.

The first type white LED chip emits a first white light of a first color temperature. The second type white LED chip emits a second white light of a second color temperature. The first color temperature is higher than the second color temperature. The color type LED chip is selected from a red LED chip, a blue LED chip and a green LED chip.

In some embodiments, the first type white LED chips of the first LED module and the second LED module are connected and controlled at the same time. The second type white LED chips of the second LED module and the third LED module are connected and controlled at the same time.

In some embodiments, there are three first LED modules respectively containing a different color type LED chip.

In some embodiments, a total numbers of the second LED module and the third LED module are the same as a total number of the first LED modules.

In some embodiments, multiple first LED modules are surrounded by the multiple second LED modules and the multiple third LED modules.

In some embodiments, the first color temperature of the first type white LED chip is between 3500K to 6500K and the second color temperature of the second type white LED chip is between 500K to 3000K.

Figure 8:
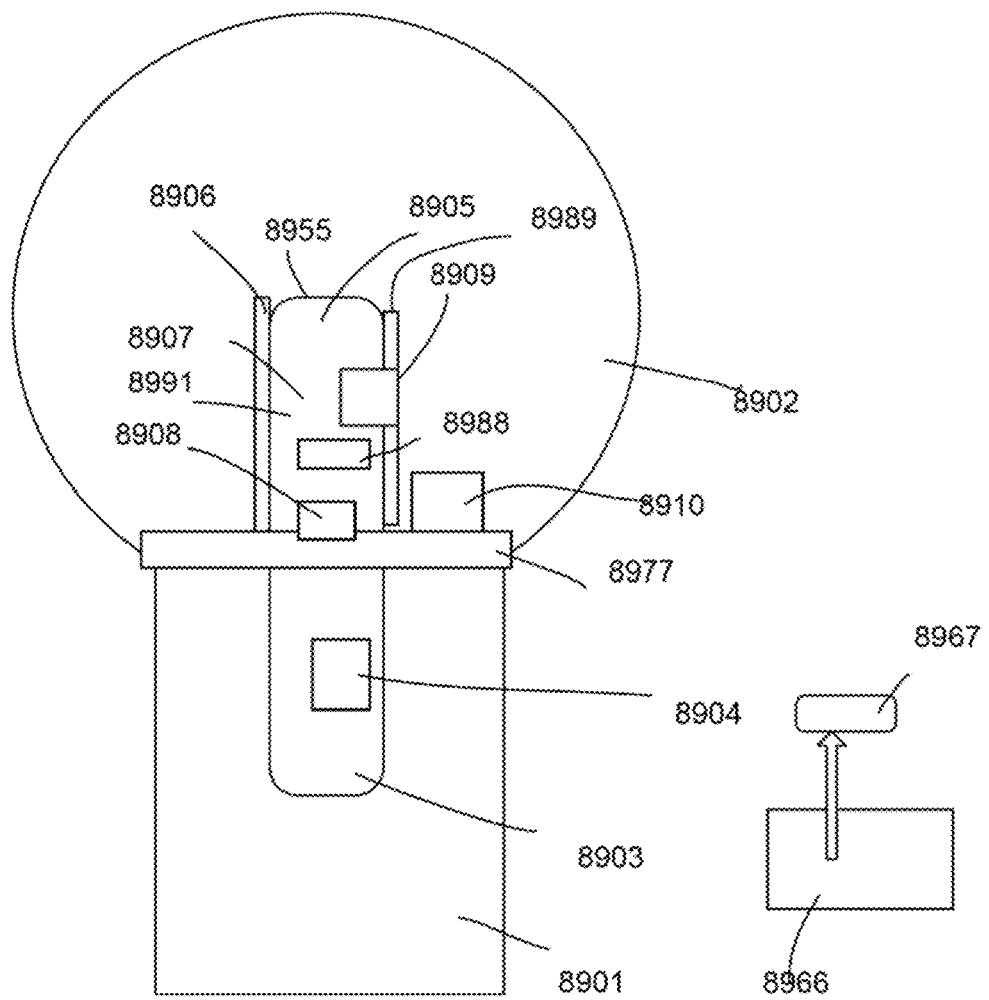
FIG. 8 illustrates a light bulb device example.

In FIG. 8, the lighting apparatus may also include a manual switch 8966 for manually adjusting parameters of the first LED module, the second LED module and the third LED module.

In some embodiments, the antenna module receives an external command to force re-activate the disabled the LED chips configured by the manual switch.

Figure 7:
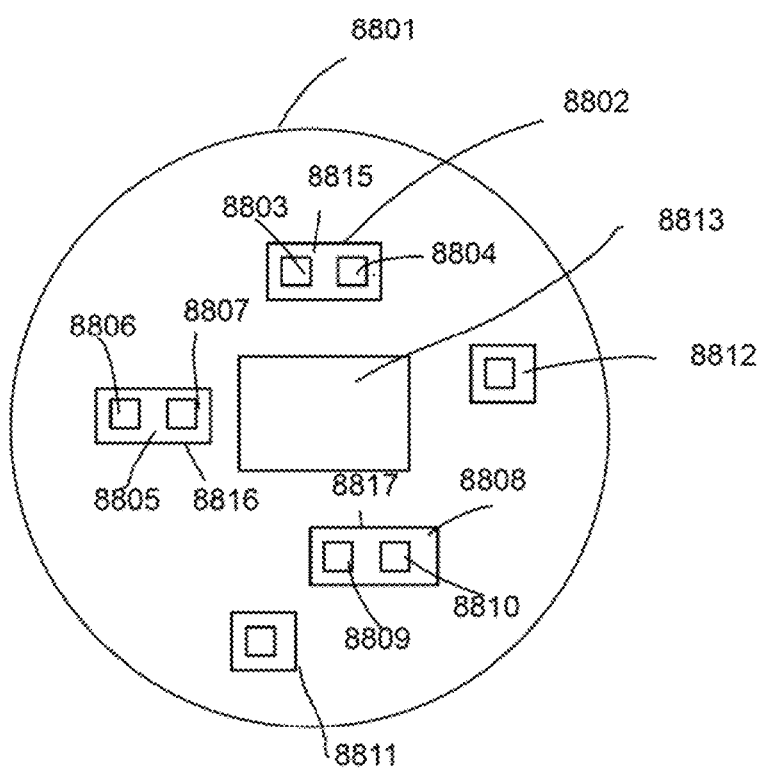
FIG. 7 illustrates a top view of an embodiment.

In FIG. 7, a lighting apparatus includes a first LED module 8802, a second LED module 8805, a third LED module 8808, and a light source plate 8801.

The first LED module 8802 includes a first package frame 8815 disposing a first LED chip 8803 and a second LED chip 8804.

The second LED module 8805 includes a second package frame 8816 disposing a third LED chip 8806 and a fourth LED chip 8807.

The third LED module 8808 includes a third package frame 0017 disposing a fifth LED chip 8809 and a sixth LED chip 8810.

The light source plate 8801 is used for mounting the first LED module 8802, the second LED module 8805 and the third LED module 8808.

A total number of red color type among the first LED chip, the second LED chip, the third LED chip, the fourth LED chip, the fifth LED chip and the sixth LED chip is more than a total number of green color type among the first LED chip, the second LED chip, the third LED chip, the fourth LED chip, the fifth LED chip and the sixth LED chip.

In FIG. 8, the lighting apparatus is a light bulb device. In some other embodiments, the lighting apparatus may be a downlight device, a panel light device, a spot light device or other types of lighting devices.

In FIG. 8, the bulb light device may have a light source plate 8977, e.g. an aluminum plate with a conductive layer, a heat dissipation layer and an insulation layer mounted with LED modules 8910.

Figure 3:
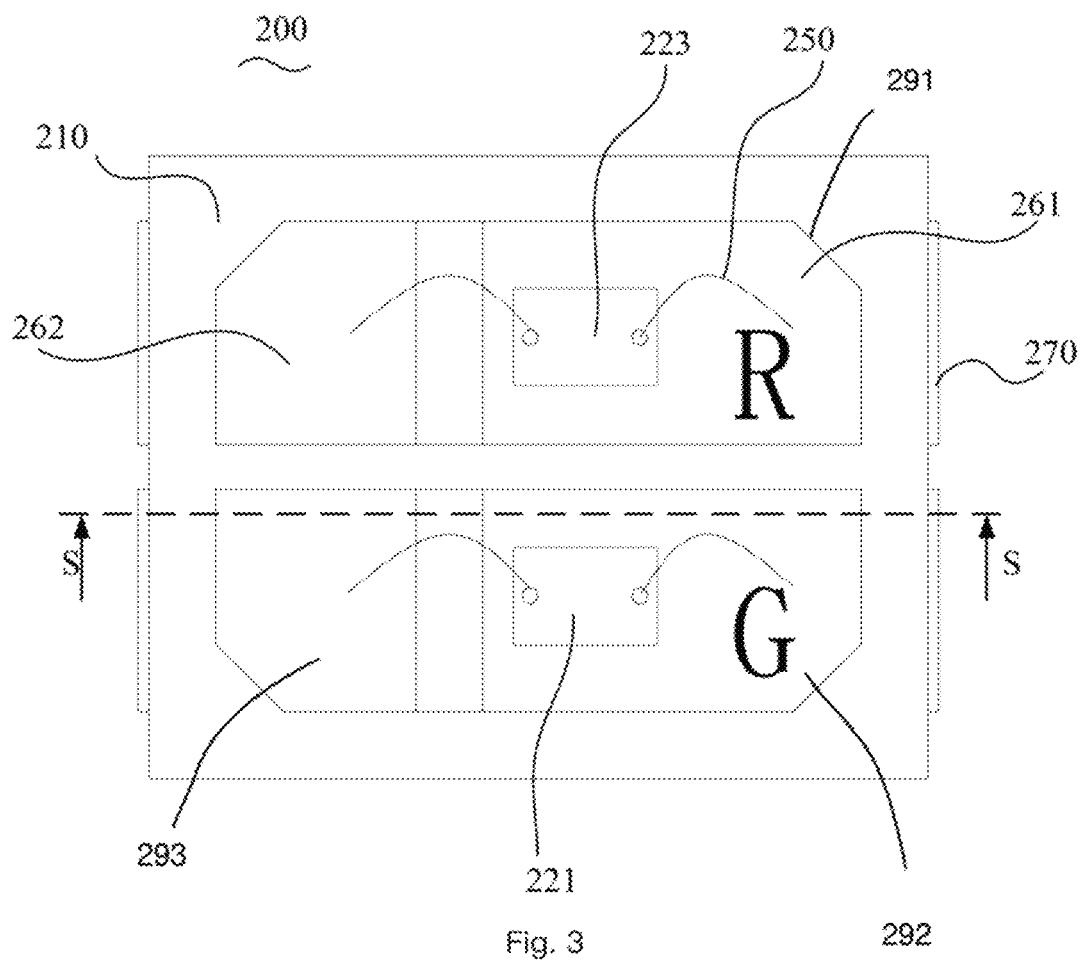
FIG. 3 illustrates a LED module example with two LED chips in a package frame.
Figure 4:
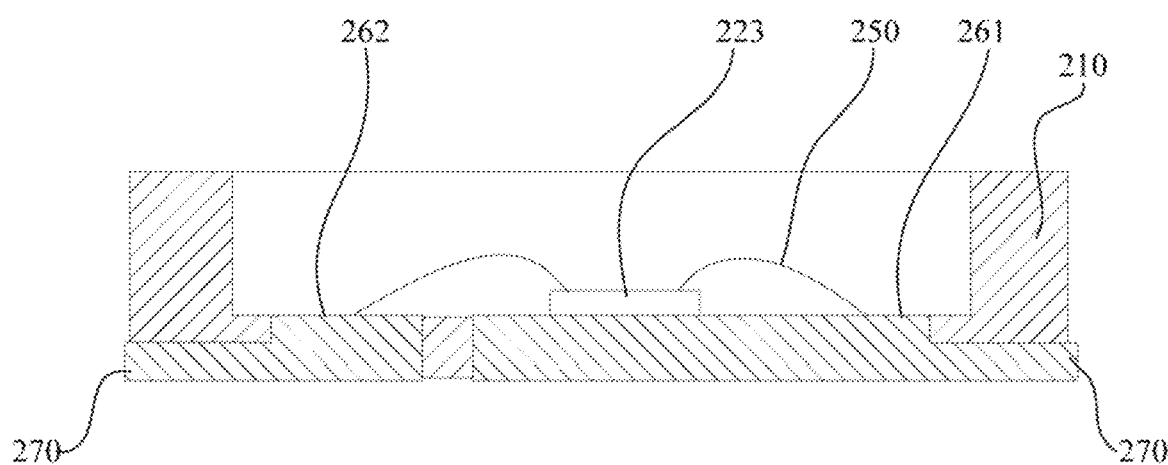
FIG. 4 illustrates a cross sectional view of a LED module example.

The LED modules have package frames, with examples in FIG. 3 and FIG. 4. The package frames have internal wiring for connecting LED chips to external electrodes for receiving driving currents.

In FIG. 8, different LED modules 8910 may be connected to a driver 8904 separately or may be connected in series, in parallel, partly in parallel and partly in series.

A bulb shell 8902 may be used for enclosing the LED modules 8910. An Edison cap 8901, with or without a heat sink cup portion may be attached to the bulb shell.

In some embodiments, the driver that is used for converting an external power source, e.g. 110V/220V alternating current to a direct current power source may be made as a module enclosed by the Edison cap.

Part of the components of the driver may be disposed on the same side or the opposite side as the LED modules on the light source plate. For example, the antenna module has a top part 8905 and a bottom part 8903 in FIG. 8.

The top part 8905 may be used for disposing an antenna 8988. A portion of complete components of circuit components of the driver may be placed at the bottom part 8903 or 8905 depending on different design requirements.

The driver may have its own circuit board, which is plugged to the light source plate with elastic metal pins so as to eliminate welding process.

In some embodiments, each LED module has more than two LED chips. In some embodiments, each LED module has only two LED chips.

For example, when needed, the first LED module has only two LED chips, while the second LED module has more than two LED chips. However, it is found in some cases that using only two LED chips meets certain optimization on light quality, assembly cost or some other factors.

In some embodiments, among the LED chips in the first LED module, the second LED module and the third LED module, the number of red LED chips, which may appear in all three LED modules have a larger number than the blue LED chips. The blue LED chips may have a larger number than the green LED chips.

For example, the first LED module has a red LED chip and a green LED chip. The second LED module has a red LED chip and a blue LED chip. The third LED module has a red LED chip and a blue LED chip. In such configuration, there are three red LED chips, two blue LED chips and one green LED chip.

Other configuration may be set but at least the configuration mentioned above is found very effective on finding balance in light device design for ensuring sufficient red and blue light being produced.

In some embodiments, the lighting apparatus may also include an antenna module disposed at a center of the light source plate.

The antenna has a protruding part as the top part 8905 from the light source plate 8917.

The first LED module, the second LED module and the third LED module are disposed surrounding the antenna module, as illustrated in FIG. 7.

People expect to add more functions and flexibility to light devices. Using wireless communication is an option. By using wireless communication, it is important to deploy an effective antenna to ensure signal quality.

In some embodiments, there is an antenna module disposed at a center of the light source plate. In the example of a bulb device, the light source plate may have a circular shape as a circular disk. In the center of the circular disk, an antenna module is disposed facing upwardly as the LED modules mentioned above toward the bulb shell.

In some embodiments, the antenna module has a plate and the plate has a protruding part protruding from a surface of the light source plate upwardly.

The LED modules are arranged surrounding the antenna module.

In some embodiments, the antenna module has a reflective layer 8906 for reflecting a light of the first LED module, the second LED module and the third LED module.

To more effectively increase light efficiency and decrease side effect of the protruding part of the antenna module, the antenna module may be added, painted or attached with a reflective layer for reflecting, instead of absorbing the light of the LED module, toward the bulb shell or other light passing cover and lens.

To further increase the light efficiency, the protruding part may have a tilt angle, e.g. to bend the reflective layer 8906 with a certain tilt angle, designed for guiding the path and direction of the reflected light. Concave or Convex structures that may change light paths may be added to the light source module too.

In FIG. 8, a fluorescent layer 8989 is disposed on the antenna module 8955.

In some embodiments, the antenna module may be added in partial area or complete area with a fluorescent layer.

When a light emitted from the LED modules hits the fluorescent layer, a light with different wave spectrum may be generated. For example, a light with a first color is emitted on a fluorescent layer and then certain reflected light may be transformed to another color of light.

In some embodiments, the antenna module has a fourth LED module 8909, 8908.

In some embodiments, when the antenna module has a protruding part, it is helpful to use the protruding part to add a light source or more light sources to add light emitted to cover more directions.

For example, one or multiple LED chips may be added on a plate of the antenna module. If the plate is a vertical board arising from the light source plate, the plate may be used for supporting the added light source, like a filament or a flexible filament mounted with LED chips.

The added light source may be used for mixing a desired light parameter with a driver.

In some embodiments, the fourth LED module may be used for providing a status of the wireless module or the driver, e.g. a blinking red light showing a first status while a green light showing another status, e.g. everything is ok for the smoke detector integrated with the lighting apparatus.

In some embodiments, the fourth LED module emits a light to a light guide 8991 of the antenna module 8955.

In some embodiments, the plate of the antenna module may have a light guide. The light guide may be made of plastic transparent materials with lots of micro dots on a surface for guiding light to emit from the micro dots.

In addition to increase visual effect, the light guide also changes light paths and guides the light direction to emit at desired positions. It would therefore provide much more flexibility when being combined with driver control.

In some embodiments, a driver circuit is attached on the antenna module.

As mentioned above, the first LED module, the second LED module and the third LED module are controlled by a driver which provides driving currents.

In some embodiments, a portion of the driver circuit of the driver are mounted on the antenna module or completely mounted on the antenna module.

A portion of the antenna module may be exposed and protruding above the light source plate while another portion of the antenna module may be disposed below the light source plate.

By integrating the antenna module and the driver makes assembly easier and provides better reliability of the lighting device.

In FIG. 8, the antenna module receives an external command 8967 from an external device 8966 via the antenna module to activate an eye protection mode for lowering a light intensity of a blue LED device from the first LED module, the second LED module and the third LED module.

A remote control like a mobile phone installed with an associated App may be used for communicating with the antenna module which provides an antenna to a wireless circuit of the driver.

The external command is received from the antenna of the antenna module and decoded by a wireless circuit disposed on the antenna module or integrated with the driver.

The external command may be translated as a mode selection from multiple options.

In some embodiments, the mode selection may be related to an eye protection mode. In the eye protection mode, the blue LED chip on the LED modules mentioned above may be turned off or their intensity being decreased to prevent blue light hurting human eyes.

Such working mode may have some drawbacks but make some users more comfortable when the light spectrum is not expected to cover full range.

In some embodiments, the antenna module receives an external command of an external device from the antenna module to activate a sleep mode for lowering a light intensity of a blue LED device and increasing a light intensity of a red LED device of the first LED module, the second LED module and the third LED module.

In some other option modes, the external command may indicate the wireless circuit of the driver to control the LED modules to lower blue light while adding more red light in a sleep mode.

It is found that with more red lights or lower frequency light, people get sleep or feel more comfortable at night when they do not need to read books or take pictures which may need a more complete light spectrum covering.

In short, the external command may be an abstract command as a sleep mode or an eye protection mode. The drivers at different lighting apparatuses determine respectively a corresponding configuration to achieve the effect of the abstract command.

In such design, the external command does not indicate specifically how to control the LED modules directly.

Instead, the external command from a remote control or a sever that is located at a living room or a remote server room may be configured to indicate a request.

The request is translated by the driver so as to generate corresponding control signals or driving currents for the LED modules.

In some embodiments, the antenna module receives an external command of an external device from the antenna module to activate a color rendering mode optimized for an object type by controlling light intensity parameters of the first LED module, the second LED module and the third LED module.

In some embodiments, users may select a color rendering mode optimized for specific type of objects.

Different light combination may provide better visual rendering effect, color rendering index, for different objects, like vegetable, clothing, metal pieces, food or any objects in different scenarios and different marketing purposes.

Users may use the external command to indicate an object type to be optimized, e.g. green vegetable, fresh fish, and the driver determines a corresponding setting to drive the LED modules.

A color configuration or a function with program codes may be transmitted to the driver to implement such function, too.

In some embodiments, the total number of red color type among the first LED chip, the second LED chip, the third LED chip, the fourth LED chip, the fifth LED chip and the sixth LED chip is more than a total number of blue color type among the first LED chip, the second LED chip, the third LED chip, the fourth LED chip, the fifth LED chip and the sixth LED chip.

In some embodiments, the total number of blue color type among the first LED chip, the second LED chip, the third LED chip, the fourth LED chip, the fifth LED chip and the sixth LED chip is more than the total number of green color type among the first LED chip, the second LED chip, the third LED chip, the fourth LED chip, the fifth LED chip and the sixth LED chip.

In some embodiments, the first LED chip is a red color LED device, the second LED chip is a green color LED device, the third LED chip is a red LED device, the fourth LED chip is a blue LED device, the fifth LED chip is a red LED device, and the sixth LED chip is a blue LED device.

In some embodiments, the LED devices of the same color in the first LED module, the second LED module and the third LED module are connected in series and controlled at the same time.

The LED devices of different colors in the first LED module, the second LED module and the third LED module are controlled separately.

In some embodiments, the lighting apparatus may also include a first white LED module with a first color temperature.

The first white LED module is disposed on the light source plate.

The first white LED module may have a color temperature mainly close to 5000K, as a high color temperature white LED module.

Even the same white LED modules may emit lights of different color temperatures. It is helpful to deploy a white LED module with a certain range of color temperature to adjust the overall light parameter.

In some embodiments, the lighting apparatus may also include a second white LED module with a second color temperature.

The second color white LED module is disposed on the light source plate, and the first color temperature is higher than the second color temperature.

Another white LED module with lower color temperature, e.g. 2000K, may be used together with the first white LED module.

The number 5000K and 2000K may be added with a range separately. For example, the 5000K color temperature may be 3500K to 6500K, and the 2000K color temperature may be 500K to 3500K.

In some embodiments, the first white LED module and the second white LED module are placed more closer than a peripheral edge than the first LED module, the second LED module and the third LED module.

In some embodiments, the first LED module, the second LED module and the third LED module are arranged at center of the light source plate while the first white LED module and the second white LED module are placed at peripheral positions of the light source plate.

It is found such arrangement provides a better light effect in some design requirements.

In some embodiments, a driver is used for supplying driving currents to the first LED module, the second LED module and the third LED module with a PWM circuit.

One LED chip of each of the first LED module, the second LED module and the third LED module is turned off when the other LED chip of each of the first LED module, the second LED module and the third LED module is turned on.

PWM (Pulse Width Modulation) is used for generating a driving current alternatively, to turn on and to turn off at a high frequency.

By adjusting the total time span in which the driving current is turned on, the light intensity of a corresponding LED chip is adjusted.

In some embodiments, the first LED module, the second LED module and the third LED module each has two LED chips. The two LED chips are turned on and turned off at different timing.

Specifically, when one LED chip is turned on at time t0, the other LED chip is turned off at time t0. When the other LED chip is turned on at time t1, the one LED chip is turned off at time t1.

Only one LED chip is turned on together with the PWM control to make the overall circuit design more elegant and reliable.

In FIG. 3, the package frame 210 has a metal pad 261 for mounting the first LED chip 223 has an inwardly concave corner 291.

The package frame may be made of plastic material. To mount the LED chips in a LED module, two or more metal pads are disposed for mounting the LED chips.

Specifically, when there are two LED chips in one LED module, each LED chip is assigned two metal pads 261, 292 for connecting to a positive terminal and a negative terminal of a power source.

There are four metal pads 261, 292, 262, 293 disposed in the package frame and the four external corners 291 of the overall metal pads are cut inwardly to form four inwardly concave corner to increase reliability and current quality of the LED module.

Figure 5:
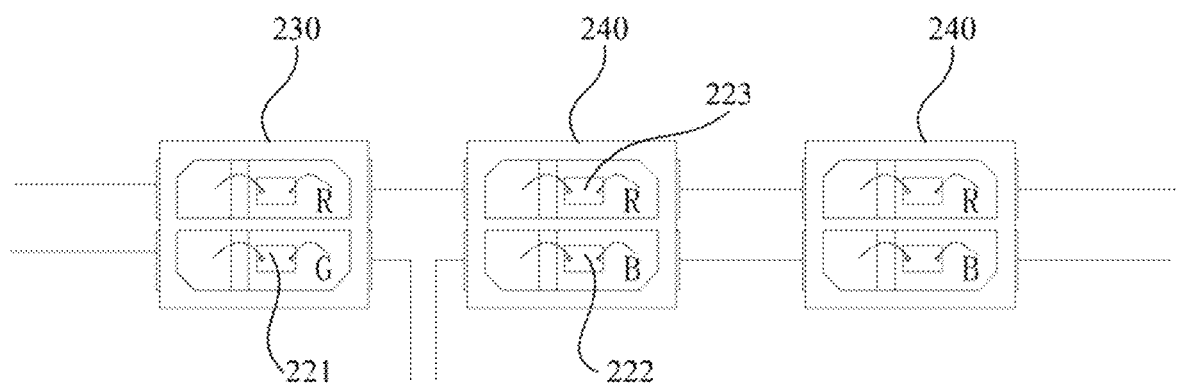
FIG. 5 illustrates conductive path example on routing power connecting multiple LED chips among LED modules.

In some embodiments, two LED chips of the first LED module, the second LED module and the third LED module have independent conductive paths connecting to a driver as illustrated in FIG. 5.

Specifically, the first LED chip is routed to the driver with a conductive path independent from another conductive path for connecting the second LED chip in the same LED module.

The LED chips with the same color may be connected with the same conductive path. For example, all red LED chips on different LED modules are connected and controlled together by the driver for arranging the red LED chips in the same conductive path.

Figure 1:
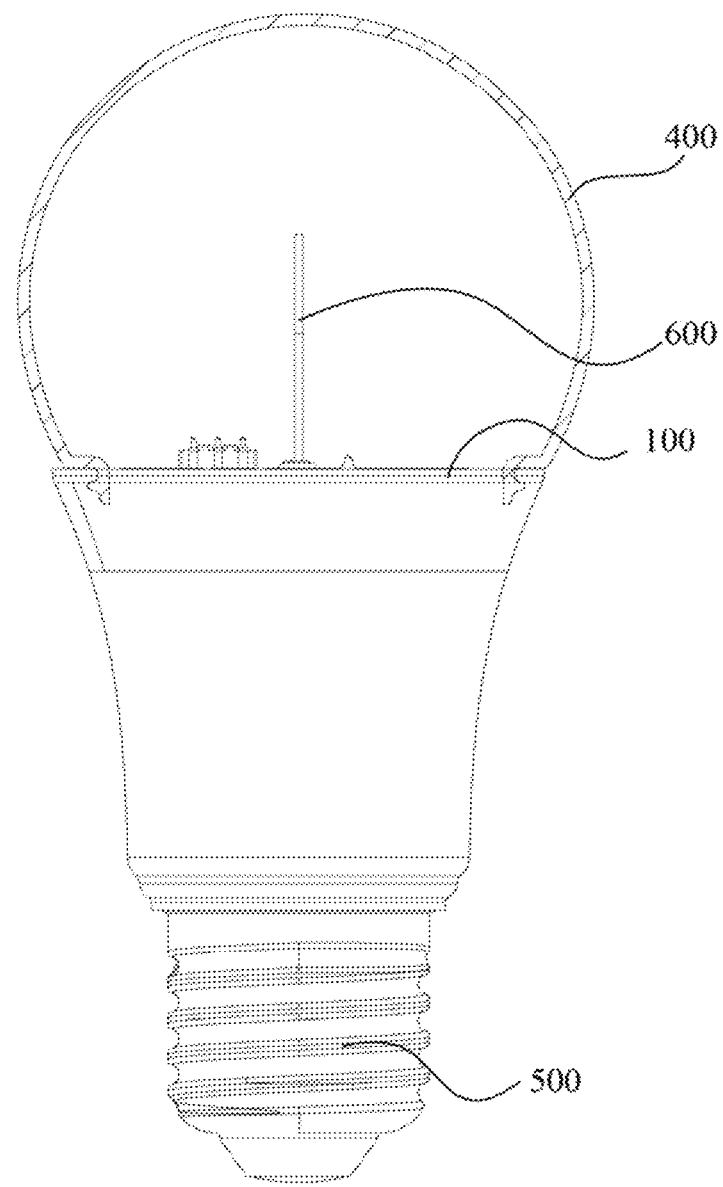
FIG. 1 illustrates a lighting apparatus of a light bulb example.

Please refer to FIG. 1, which illustrates a light bulb example.

In FIG. 1, a bulb shell 400 covers a light source plate 100. There is an antenna module 600 disposed at a center of the light source plate 100. An Edison cap 500 is attached to the bulb shell 400.

Figure 2:
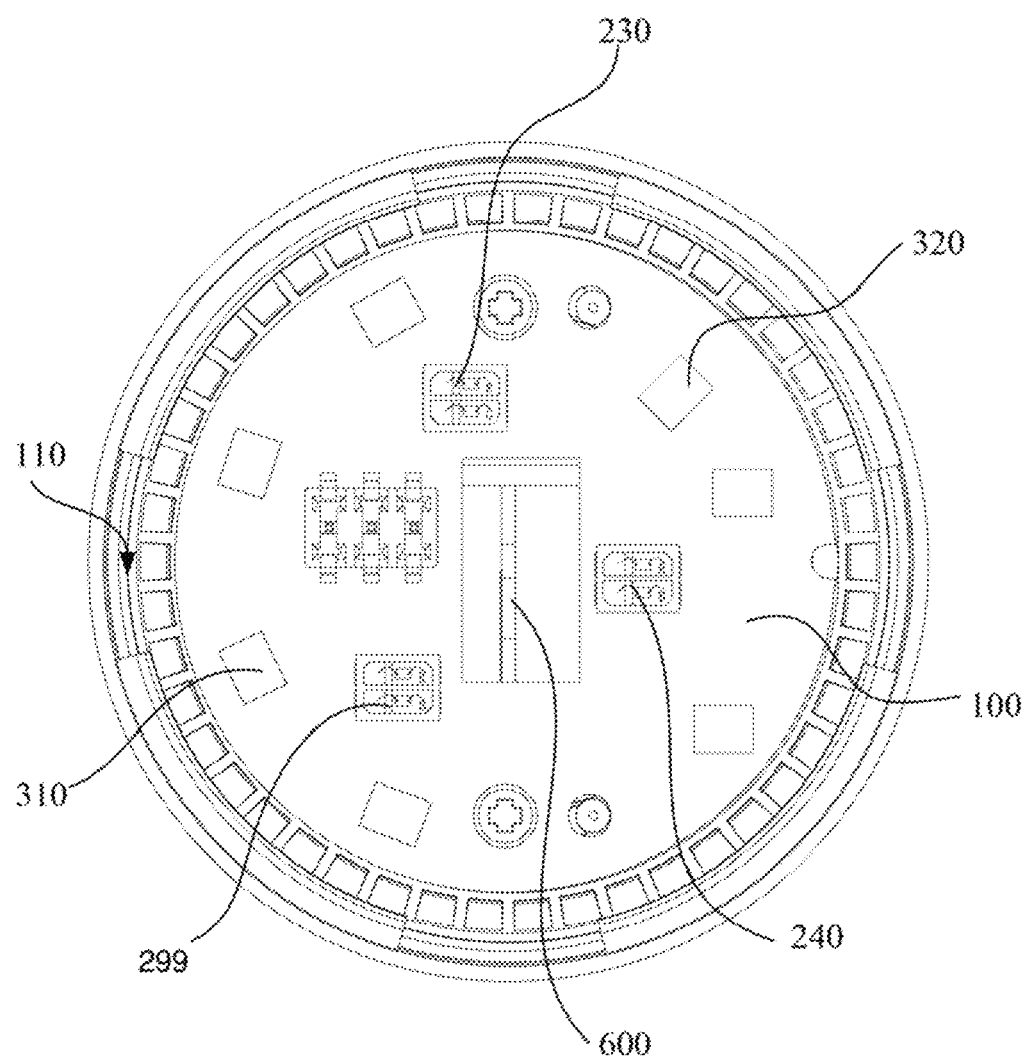
FIG. 2 illustrates a top view of a light source plate mounted with LED modules.

In FIG. 2, a top view of the light source plate is illustrated.

In FIG. 2, the light source plate has holes for fixing or plugging to the Edison cap or a heat sink cup. A first LED chip 230, a second LED module 299 and a third LED module 240 are disposed on the light source plate 100. In addition, a first white LED module 310 with high color temperature and a second white LED module 320 are disposed on the light source plate 100. An antenna module 600 is placed at the center of the light source plate 100.

In FIG. 3, a LED module 200 has a package frame 210 which is mounted with a first chip 223 and a second LED chip 221. There are wires 250 for connecting the electrodes of the first LED chip 223 and the second LED chip 221 to four pads 261, 262, 292, 293. The four pads 261, 262, 292, 293 are further electrically connected to external electrodes 270.

In FIG. 4, a cross section view of the example in FIG. 3 is provided. The same reference numerals refer to the same components.

FIG. 5 show the conductive path routing for the LED chips 221, 222, 223 of the LED modules 230, 240. In FIG. 5, there are two LED modules with red LED chip and blue LED chip. In the example of FIG. 5, the same color LED chips are connected together. Different color LED chips are connected separately.

Figure 6:
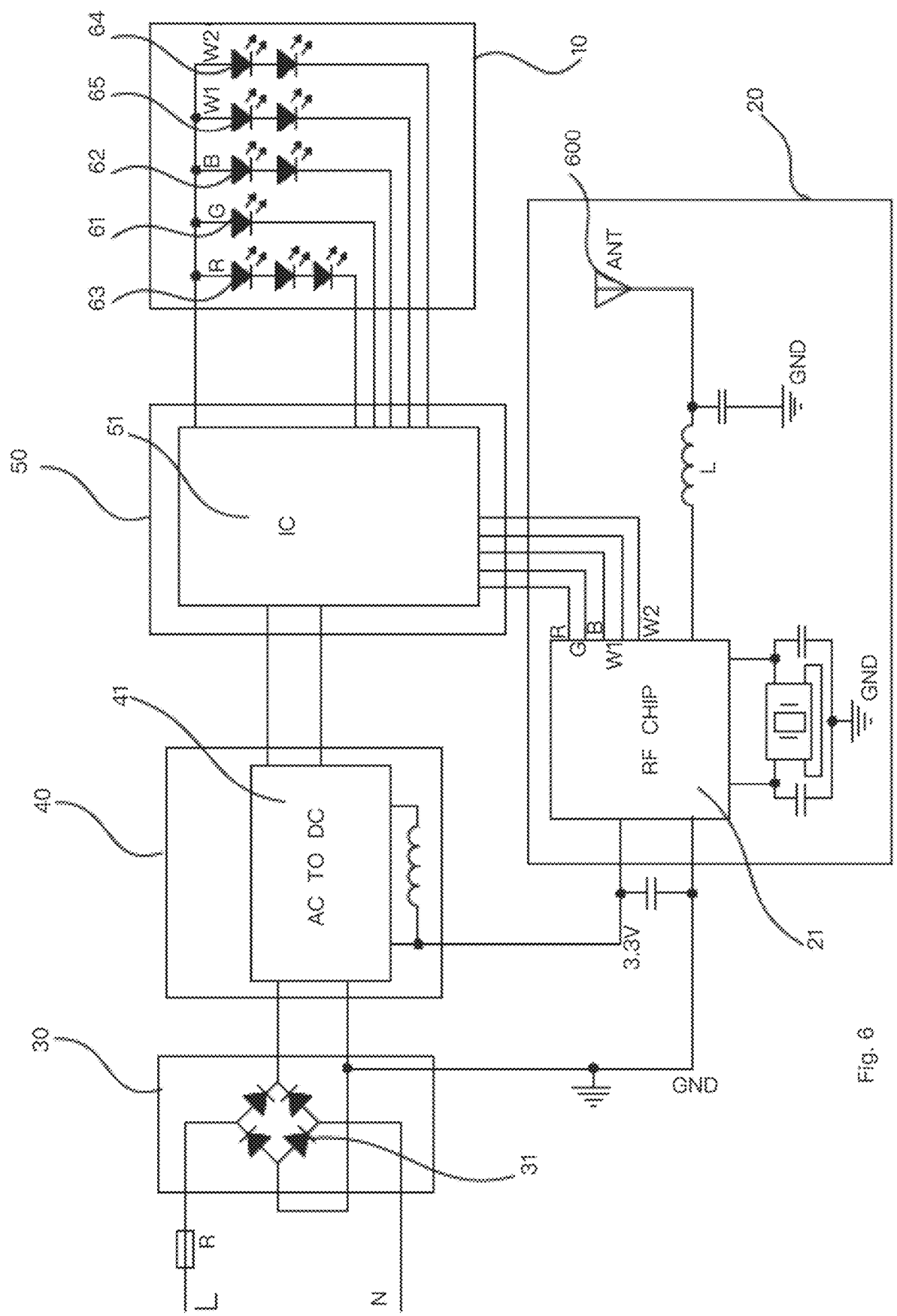
FIG. 6 illustrates a circuit diagram for implementing a lighting apparatus.

FIG. 6 shows a circuit diagram.

In FIG. 6, a rectifier 30 has a bridge circuit 31 for rectifying an input power source. A power circuit 40 has an AC-to-DC converter 41. A driver module 50 includes constant current chip 51.

There is a RF chip 21 as an antenna module 20. The antenna 600 is used for receiving an external command 600. A light source module 10 has LED modules 61, 63, 62, 65, 64.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus comprising:
   a first LED module, comprising a first package frame disposing one color type LED chip and one first type white LED chip;
   a second LED module comprising a second package frame disposing one first type white LED chip and one second type white LED chip;
   a third LED module comprising a third package frame disposing one second type white LED;
   a light source plate for mounting the first LED module, the second LED module and the third LED module,
   wherein the first type white LED chip emits a first white light of a first color temperature, the second type white LED chip emits a second white light of a second color temperature, the first color temperature is higher than the second color temperature, the color type LED chip is selected from a red LED chip, a blue LED chip and a green LED chip; and
   an antenna module disposed at a center of the light source plate, wherein the antenna has a protruding part from the light source plate, the first LED module, the second LED module and the third LED module are disposed surrounding the antenna module, wherein the antenna module receives an external command from an external device via the antenna module to activate an eye protection mode for lowering a light intensity of blue LED chip from the first LED module.

2. The lighting apparatus of claim 1, wherein the antenna module has a reflective layer for reflecting a light of the first LED module, the second LED module and the third LED module.

3. The lighting apparatus of claim 1, wherein a fluorescent layer is disposed on the antenna module.

4. The lighting apparatus of claim 1, wherein the antenna module has a fourth LED module.

5. The lighting apparatus of claim 4, wherein the fourth LED module emits a light to a light guide of the antenna module.

6. The lighting apparatus of claim 1, wherein a driver circuit is attached on the antenna module.

7. The lighting apparatus of claim 1, wherein the antenna module receives an external command of an external device from the antenna module to activate a sleep mode for lowering a light intensity of the blue LED chip and increasing a light intensity of the red LED device of the first LED module.

8. The lighting apparatus of claim 1, wherein the antenna module receives an external command of an external device from the antenna module to activate a color rendering mode optimized for an object type by controlling light intensity parameters of the first LED module, the second LED module and the third LED module.

9. The lighting apparatus of claim 1, wherein the first type white LED chips of the first LED module and the second LED module are connected and controlled at the same time, the second type white LED chips of the second LED module and the third LED module are connected and controlled at the same time.

10. The lighting apparatus of claim 1, wherein there are three first LED modules respectively containing a different color type LED chip.

11. The lighting apparatus of claim 10, wherein a total numbers of the second LED module and the third LED module are the same as a total number of the first LED modules.

12. The lighting apparatus of claim 10, wherein multiple first LED modules are surrounded by the multiple second LED modules and the multiple third LED modules.

13. The lighting apparatus of claim 1, wherein a driver is used for supplying driving currents to the first LED module, the second LED module and the third LED module with a PWM circuit, one LED chip of the first LED module, the second LED module and the third LED module is turned off when the other LED chip of the first LED module, the second LED module and the third LED module is turned on.

14. The lighting apparatus of claim 1, wherein the package frame has a metal pad for mounting the first LED chip has an inwardly concave corner.

15. The lighting apparatus of claim 14, wherein two LED chips of the first LED module, the second LED module and the third LED module have independent conductive paths connecting to a driver.

16. The lighting apparatus of claim 1, wherein the first color temperature of the first type white LED chip is between 3500K to 6500K and the second color temperature of the second type white LED chip is between 500K to 3000K.

17. The lighting apparatus of claim 1, further comprising a manual switch for manually disabling a portion of the first color type LED chip, the first type white LED chip, and the second type white LED chip.

18. The lighting apparatus of claim 17, wherein the antenna module receives an external command to force re-activate the disabled the LED chips configured by the manual switch.

* * * * *